US009653503B2

(12) United States Patent
Lee et al.

(10) Patent No.: US 9,653,503 B2
(45) Date of Patent: May 16, 2017

(54) IMAGE SENSOR AND IMAGE PROCESSING SYSTEM INCLUDING THE SAME

(71) Applicants: Ji Won Lee, Daegu (KR); Seung Sik Kim, Hwaseong-si (KR); Young Chan Kim, Seongnam-si (KR); Tae Han Kim, Suwon-si (KR); Eun Sub Shim, Anyang-si (KR); Dong Joo Yang, Seongnam-si (KR); Min Seok Oh, Osan-si (KR); Moo Sup Lim, Yongin-si (KR)

(72) Inventors: Ji Won Lee, Daegu (KR); Seung Sik Kim, Hwaseong-si (KR); Young Chan Kim, Seongnam-si (KR); Tae Han Kim, Suwon-si (KR); Eun Sub Shim, Anyang-si (KR); Dong Joo Yang, Seongnam-si (KR); Min Seok Oh, Osan-si (KR); Moo Sup Lim, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/741,740

(22) Filed: Jun. 17, 2015

(65) Prior Publication Data
US 2015/0372038 A1 Dec. 24, 2015

(30) Foreign Application Priority Data
Jun. 18, 2014 (KR) ........................ 10-2014-0074564

(51) Int. Cl.
H01L 27/146 (2006.01)
H04N 5/378 (2011.01)
(Continued)

(52) U.S. Cl.
CPC .. *H01L 27/14623* (2013.01); *H01L 27/14609* (2013.01); *H01L 27/14643* (2013.01);
(Continued)

(58) Field of Classification Search
CPC ............. H01L 27/146; H01L 27/14623; H01L 27/14609; H01L 27/14643; H04N 5/225;
(Continued)

(56) References Cited

U.S. PATENT DOCUMENTS 6,166,768 A * 12/2000 Fossum ................ G11C 19/282
257/E27.134
7,271,835 B2 9/2007 Iizuka et al.
(Continued)

FOREIGN PATENT DOCUMENTS

JP 2007115803 A 5/2007
JP 2012164892 A 8/2012
(Continued)

*Primary Examiner* — Tuan Ho
*Assistant Examiner* — Marly Camargo
(74) *Attorney, Agent, or Firm* — Harness, Dickey & Pierce, P.L.C.

(57) ABSTRACT

An image sensor capable of boosting a voltage of a floating diffusion node is provided. The image sensor includes a floating diffusion node and a storage element which are in a semiconductor substrate. The image sensor includes a first light-shielding material formed over the floating diffusion node, and a second light-shielding material formed over the storage diode. The second light-shielding material is separated from the first light-shielding material. The image sensor also includes a first voltage supply line configured to apply a first voltage to the first light-shielding material and a second voltage supply line configured to apply a second voltage lower than the first voltage to the second light-shielding material.

20 Claims, 12 Drawing Sheets

(51) Int. Cl.
*H04N 5/335* (2011.01)
*H04N 5/355* (2011.01)
*H04N 5/359* (2011.01)
*H04N 5/369* (2011.01)

(52) U.S. Cl.
CPC ......... *H04N 5/3592* (2013.01); *H04N 5/3696* (2013.01); *H04N 5/378* (2013.01)

(58) Field of Classification Search
CPC ........ H04N 5/235; H04N 5/247; H04N 5/335; H04N 5/378; H04N 5/3559
USPC ........ 348/308, 294; 257/291, 292, 443, 239; 250/208.1
See application file for complete search history.

(56) References Cited

U.S. PATENT DOCUMENTS

| | | | |
|---|---|---|---|
| 7,361,877 B2 | 4/2008 | McGrath et al. | |
| 8,294,077 B2 | 10/2012 | Mao et al. | |
| 8,493,487 B2 * | 7/2013 | Takada | H01L 27/14603 348/308 |
| 8,563,914 B2 | 10/2013 | Ahn et al. | |
| 8,860,862 B2 * | 10/2014 | Kobayashi | H01L 27/14603 348/294 |
| 9,224,774 B2 * | 12/2015 | Kobayashi | H01L 27/14603 |
| 2007/0147132 A1 | 6/2007 | Lee et al. | |
| 2009/0072336 A1 * | 3/2009 | Kitano | H01L 27/14601 257/435 |
| 2009/0078976 A1 * | 3/2009 | Kitano | H01L 27/14601 257/292 |
| 2011/0242386 A1 * | 10/2011 | Machida | H01L 27/14603 348/308 |
| 2011/0298024 A1 * | 12/2011 | Kitano | H01L 27/14601 250/208.1 |
| 2012/0153126 A1 * | 6/2012 | Oike | H01L 27/14603 250/208.1 |
| 2013/0082313 A1 * | 4/2013 | Manabe | H01L 27/14603 257/292 |
| 2015/0256769 A1 * | 9/2015 | Kim | H01L 27/14607 348/302 |

FOREIGN PATENT DOCUMENTS

| | | |
|---|---|---|
| KR | 20070073207 A | 7/2007 |
| KR | 20070113607 A | 11/2007 |
| KR | 1020070113608 | 11/2007 |

\* cited by examiner

IMAGE SENSOR AND IMAGE PROCESSING SYSTEM INCLUDING THE SAME

CROSS-REFERENCE TO RELATED APPLICATIONS

This application claims priority under 35 U.S.C. §119(a) from Korean Patent Application No. 10-2014-0074564 filed on Jun. 18, 2014, the disclosure of which is hereby incorporated by reference in its entirety.

BACKGROUND

At least one example embodiment of the inventive concepts relates to an image sensor, and more particularly, to an image sensor capable of boosting a voltage of a floating diffusion node and/or an image processing system including the same.

An image sensor is a device that converts an optical image into an electrical signal and may be used in digital cameras and other image processing devices.

Image sensors include a pixel array including a plurality of pixels. Each of the pixels includes a photoelectric conversion element that performs photoelectric conversion, a transfer transistor that transmits charges generated by the photoelectric conversion element to a floating diffusion node, a reset transistor that resets the floating diffusion node, a source follower that operates in response to the charges at the floating diffusion node, and a select transistor that transmits signals output from the source follower to a column line.

A gate of the source follower is connected to the floating diffusion node. In order to increase the amount of charges that can be stored at the floating diffusion node, an operating voltage applied to pixels or a capacitance of the floating diffusion node is increased. However, the increase of the operating voltage applied to pixels may lead the increase of the power consumption of an image sensor including pixels and the increase of the capacitance of the floating diffusion node may lead the increase of the size of pixels. Therefore, these methods are not appropriate for image sensors requiring high resolution and low power consumption.

SUMMARY

At least one example embodiment of the inventive concepts provides an image sensor capable of boosting a voltage of a floating diffusion node without increasing an operating voltage applied to pixels and/or a capacitance of the floating diffusion node and/or an image processing system including the same.

According to at least one example embodiment of the inventive concepts, there is provided an image sensor including a floating diffusion node and a storage element which are formed in a semiconductor substrate, a first light-shielding material formed over the floating diffusion node, and a second light-shielding material formed over the storage diode, the second light-shielding material being separated from the first light-shielding material.

According to at least one example embodiment, the image sensor may further include a first voltage supply line configured to apply a first voltage to the first light-shielding material and a second voltage supply line configured to apply a second voltage lower than the first voltage to the second light-shielding material. The second voltage supply line may be a ground voltage line. The first light-shielding material and the second light-shielding material may include tungsten.

According to at least one example embodiment of the inventive concepts, there is provided an image sensor including a floating diffusion node, a first light-shielding material formed over the floating diffusion node, and a row driver configured to apply a positive voltage to the first light-shielding material. The image sensor may further include a storage element and a second light-shielding material formed over the storage element to be separated from the first light-shielding material. The second light-shielding material may be connected to a ground voltage.

According to at least one example embodiment, the image sensor may further include a photoelectric conversion element and a transfer transistor configured to transfer charges accumulated by the photoelectric conversion element to the floating diffusion node. The row driver may be configured to apply a transfer control signal having a first pulse width to a gate of the transfer transistor and may be configured to apply the positive voltage having a second pulse width to the first light-shielding material. The second pulse width may be the same as or the greater than the first pulse width. A time at which the positive voltage is applied may be the same as or earlier than a time at which the transfer control signal is applied.

According to at least one example embodiment, the image sensor may further include a source follower configured to operate according to a voltage of the floating diffusion node and a selection transistor configured to apply an output voltage of the source follower to a column line in response to a selection signal output from the row driver. The row driver may apply the positive voltage to the first light-shielding material while the selection signal is activated.

According to at least one example embodiment, the image sensor may include a sampler configured to sample a reset signal before the positive voltage is applied to the first light-shielding material and sample an image signal after the positive voltage is applied to the first light-shielding material.

According to at least one example embodiment of the inventive concepts, there is provided an image processing system including an image sensor and a processor configured to process image data output from the image sensor. The image sensor includes a floating diffusion node and a storage element which are formed in a semiconductor substrate, a first light-shielding material formed over the floating diffusion node, and a second light-shielding material formed over the storage element, the second light-shielding material being separated from the first light-shielding material.

According to at least one example embodiment, the image processing system may further include a first voltage supply line configured to apply a first voltage to the first light-shielding material and a second voltage supply line configured to apply a second voltage lower than the first voltage to the second light-shielding material.

According to at least one example embodiment, the image processing system may further include a row driver configured to apply the first voltage to the first light-shielding material through the first voltage supply line. The first voltage may be a positive voltage. The image sensor may perform a global shutter operation. The image processing system may further include a serial camera interface configured to transmit the image data from the image sensor to the processor.

According to at least one example embodiment of the inventive concepts, there is provided a method of operating an image sensor which includes a pixel including a first light-shielding material formed over a floating diffusion node and a second light-shielding material formed over a storage diode. The method includes applying a first voltage to the first light-shielding material and applying a second voltage to the second light-shielding material, the first voltage being greater than the second voltage.

According to at least one example embodiment, the method may further include resetting the floating diffusion node, sampling a reset signal output from the pixel before applying the first voltage to the first light-shielding material, and sampling an image signal output from the pixel after applying the first voltage to the first light-shielding material.

According to at least one example embodiment, the applying a first voltage to the first light-shielding material may be performed before charges generated by a photoelectric conversion element included in the pixel are transmitted to the floating diffusion node. Alternatively, the applying a first voltage to the first light-shielding material may be performed when charges generated by a photoelectric conversion element included in the pixel are transmitted to the floating diffusion node. The first voltage may be a positive voltage and the second voltage may be a ground voltage.

According to at least one example embodiment, an image sensor includes a first storage element and a second storage element. The first storage element and the second storage element are configured to store charges collected by a photoelectric conversion element. The image sensor may include a first light-shielding material covering the first storage element, and a second light-shielding material covering the second storage element. The second light-shielding material may be electrically isolated from the first light-shielding material.

According to at least one example embodiment, the first storage element and the second storage element are in a semiconductor substrate. The first storage element includes a first capacitive structure and a second capacitive structure, the first capacitive structure including a conductor, the semiconductor substrate, and a ground voltage line, the second capacitive structure including the conductor, the semiconductor substrate, and the first light shielding material. The second storage element is a storage diode.

According to at least one example embodiment, the first light-shielding material and the second light-shielding material include tungsten.

According to at least one example embodiment, the image sensor includes a row driver configured to boost a storage capacity of the first storage element by applying a first voltage to the first storage element while a second voltage is applied to the second storage element, the first voltage being greater than the second voltage.

According to at least one example embodiment, the image sensor includes a transfer element configured to apply a transfer control signal such that charges collected by the photoelectric conversion element are transferred from the second storage element to the first storage element having the boosted storage capacity.

According to at least one example embodiment, the image sensor includes a sampler configured to sample a reset signal before the row driver applies the first voltage and sample an image signal after the row driver applies the first voltage. The image signal may be a signal generated by charges stored the first storage element having the boosted storage capacity.

According to at least one example embodiment, the first voltage is a positive voltage and the second voltage is a ground voltage.

BRIEF DESCRIPTION OF THE DRAWINGS

The above and other features and advantages of the inventive concept will become more apparent by describing in detail exemplary embodiments thereof with reference to the attached drawings in which.

DETAILED DESCRIPTION OF EXAMPLE EMBODIMENTS

Figure 1:
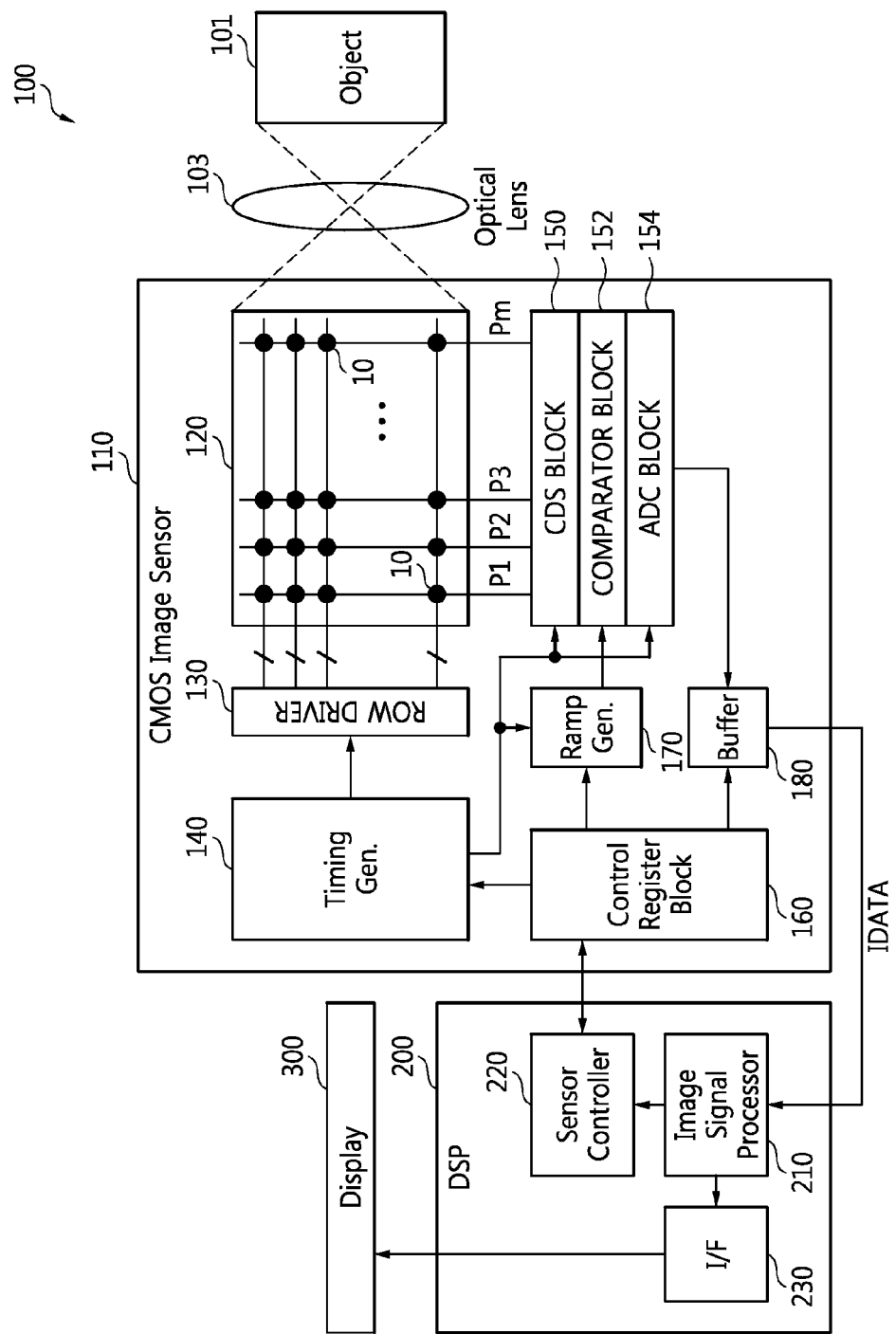
FIG. 1 is a block diagram of an image processing system according to at least one example embodiment of the inventive concepts.

Inventive concepts will now be described more fully with reference to the accompanying drawings, in which example embodiments of are shown. These example embodiments are provided so that this disclosure will be thorough and complete, and will fully convey inventive concepts of to those skilled in the art. Inventive concepts may be embodied in many different forms with a variety of modifications, and a few embodiments will be illustrated in drawings and explained in detail. However, this should not be construed as being limited to example embodiments set forth herein, and rather, it should be understood that changes may be made in these example embodiments without departing from the principles and spirit of inventive concepts, the scope of which are defined in the claims and their equivalents. Like numbers refer to like elements throughout. In the drawings, the thicknesses of layers and regions are exaggerated for clarity.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Specific details are provided in the following description to provide a thorough understanding of example embodiments. However, it will be understood by one of ordinary skill in the art that example embodiments may be practiced without these specific details. For example, systems may be shown in block diagrams so as not to obscure example embodiments in unnecessary detail. In other instances, well-known processes, structures and techniques may be shown without unnecessary detail in order to avoid obscuring example embodiments.

In the following description, illustrative embodiments will be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware in existing electronic systems (e.g., electronic imaging systems, image processing systems, digital point-and-shoot cameras, personal digital assistants (PDAs), smartphones, tablet personal computers (PCs), laptop computers, etc.). Such existing hardware may include one or more Central Processing Units (CPUs), digital signal processors (DSPs), application-specific-integrated-circuits (ASICs), field programmable gate arrays (FPGAs) computers or the like.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium", "computer readable storage medium" or "non-transitory computer readable storage medium" may represent one or more devices for storing data, including read only memory (ROM), random access memory (RAM), magnetic RAM, core memory, magnetic disk storage mediums, optical storage mediums, flash memory devices and/or other tangible or non-transitory machine readable mediums for storing information. The term "computer-readable medium" may include, but is not limited to, portable or fixed storage devices, optical storage devices, and various other tangible or non-transitory mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, a processor or processors may be programmed to perform the necessary tasks, thereby being transformed into special purpose processor(s) or computer(s).

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "includes", "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

FIG. 1 is a block diagram of an image processing system 100 according to at least one example embodiment of the inventive concepts. The image processing system 100 may be implemented as a portable electronic device such as a laptop computer, a cellular phone, a smart phone, a tablet personal computer (PC), a personal digital assistant (PDA), an enterprise digital assistant (EDA), a digital still camera, a digital video camera, a portable multimedia player (PMP), a mobile internet device (MID), a wearable computer, an internet of things (IoT) device, or an internet of everything (IoE) device.

The image processing system 100 includes an optical lens 103, a complementary metal-oxide-semiconductor (CMOS) image sensor 110, a digital signal processor (DSP) 200, and a display 300. The components 110 and 200 may be implemented on a chip (e.g., semiconductor chip).

The CMOS image sensor 110 may generate image data IDATA corresponding to an object 101 input through or captured by the optical lens 103. The CMOS image sensor 110 includes a pixel (or active pixel sensor (APS)) array 120, a row driver 130, a timing generator 140, a correlated double sampling (CDS) block 150, a comparator block 152, an analog-to-digital conversion (ADC) block 154, a control register block 160, a ramp signal generator 170, and a buffer 180. The CMOS image sensor 110 may be formed in a structure that allows a global shutter operation to be performed.

The pixel array 120 includes a plurality of pixels 10 arranged in a matrix. Each of the pixels 10 has a structure that increases the amount of charges stored in a floating diffusion node (or a floating diffusion region) without increasing the operating voltage of each pixel 10 and the capacitance of the floating diffusion node. The structure and the operations of each pixel 10 will be described in detail with reference to FIGS. 2 through 9 later.

The row driver 130 may transmit a plurality of control signals for controlling the operations of the pixels 10 to the pixel array 120 according to the control of the timing generator 140. The control signals will be described in detail with reference to FIG. 2 and FIGS. 4 through 8.

The timing generator 140 controls the operations of a row driver 130, a CDS block 150, an ADC block 154, and a ramp signal generator 170 according to the control of the control register block 160. The CDS block 150 performs CDS on pixel signals P1 through Pm (where "m" is a natural number) output from respective ones of a plurality of column lines included in the pixel array 120.

The comparator block 152 compares a plurality of correlated double sampled pixel signals output from the CDS block 150 with a ramp signal output from the ramp signal generator 170 and outputs a plurality of comparison signals according to the comparison result. The CDS block 150 and the comparator block 152 may also be referred to collectively as a sampler. The ADC block 154 converts the comparison signals output from the comparator block 152 into digital signals and outputs the digital signals to the buffer 180.

The control register block 160 controls the operations of the timing generator 140, the ramp signal generator 170, and the buffer 180 according to the control of the DSP 200. The buffer 180 transmits the image data IDATA corresponding to the digital signals output from the ADC block 154 to the DSP 200.

The DSP 200 includes an image signal processor 210, a sensor controller 220, and an interface 230. The image signal processor 210 controls the sensor controller 220 and the interface 230. The sensor controller 220 controls the control register block 160. According to at least one example embodiment, the CMOS image sensor 110 and the DSP 200 may be implemented on respective chips in a package, e.g., a multi-chip package. Alternatively, the CMOS image sensor 110 and the image signal processor 210 may be implemented on respective chips in a package, e.g., a multi-chip package. As another alternative, the CMOS image sensor 110 and the image signal processor 210 may be implemented together on a single chip.

The image signal processor 210 processes the image data IDATA received from the buffer 180 and transmits processed image data to the interface 230.

The sensor controller 220 generates various control signals for controlling the control register block 160 according to the control of the image signal processor 210. The interface 230 transmits the processed image data from the image signal processor 210 to the display 300.

The display 300 displays the image data received from the interface 230. For example, the display 300 may be implemented as a thin film transistor-liquid crystal display (TFT-LCD), a light emitting diode (LED) display, an organic LED (OLED) display, an active-matrix OLED (AMOLED) display, etc.

Figure 2:
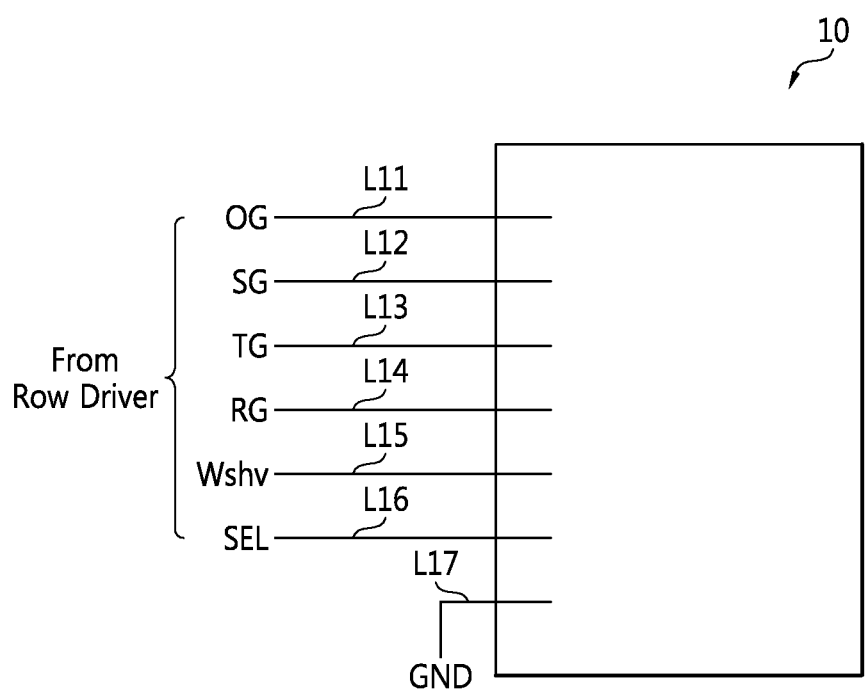
FIG. 2 is a diagram of control signals applied to a pixel illustrated in FIG. 1.

FIG. 2 is a diagram of control signals applied to each of the pixels 10 illustrated in FIG. 1. Referring to FIGS. 1 and 2, a plurality of control signals OG, SG, TG, RG, Wshv, and SEL output from the row driver 130 may be transmitted to each pixel 10 through a plurality of lines L11 through L16, respectively. When a second voltage GND is a ground voltage, the second voltage GND may be applied to the pixel 10 through a ground line L17. Further, the row driver 130 may transmit a first voltage (e.g., a positive voltage) Wshv for boosting a voltage of a floating diffusion node to the pixel 10 through the line L15.

Figure 3A:
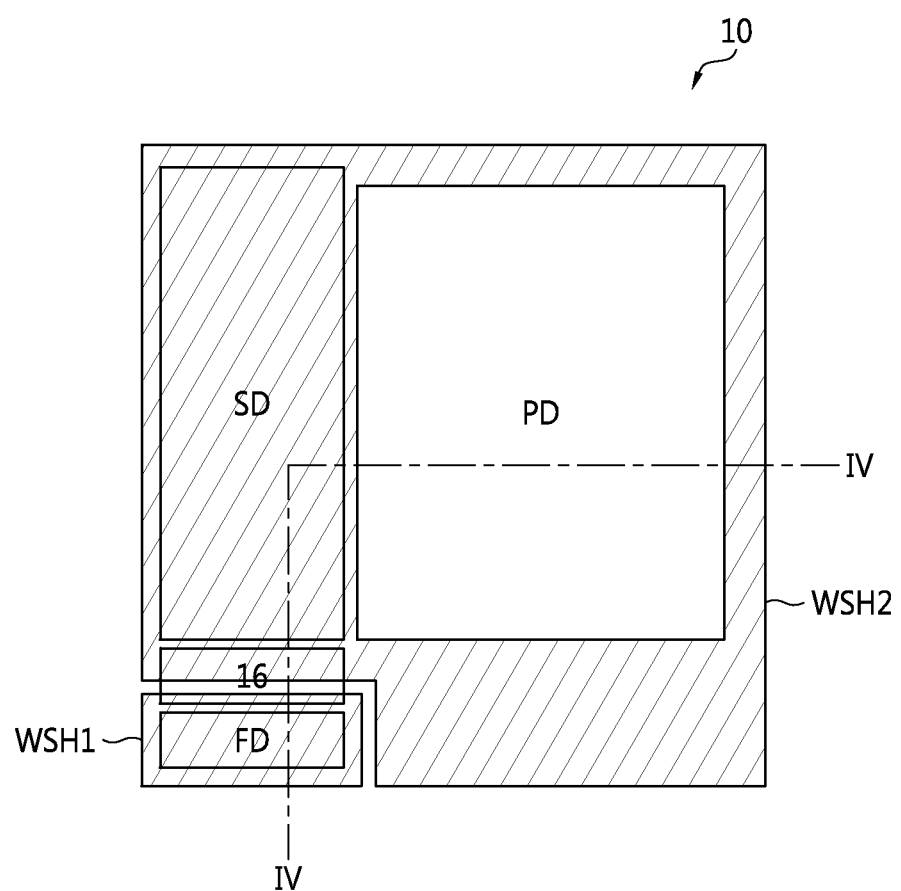
FIGS. 3A and 3B are plan views of the pixel illustrated in FIG. 1 according to at least one example embodiment of the inventive concepts.
Figure 3B:
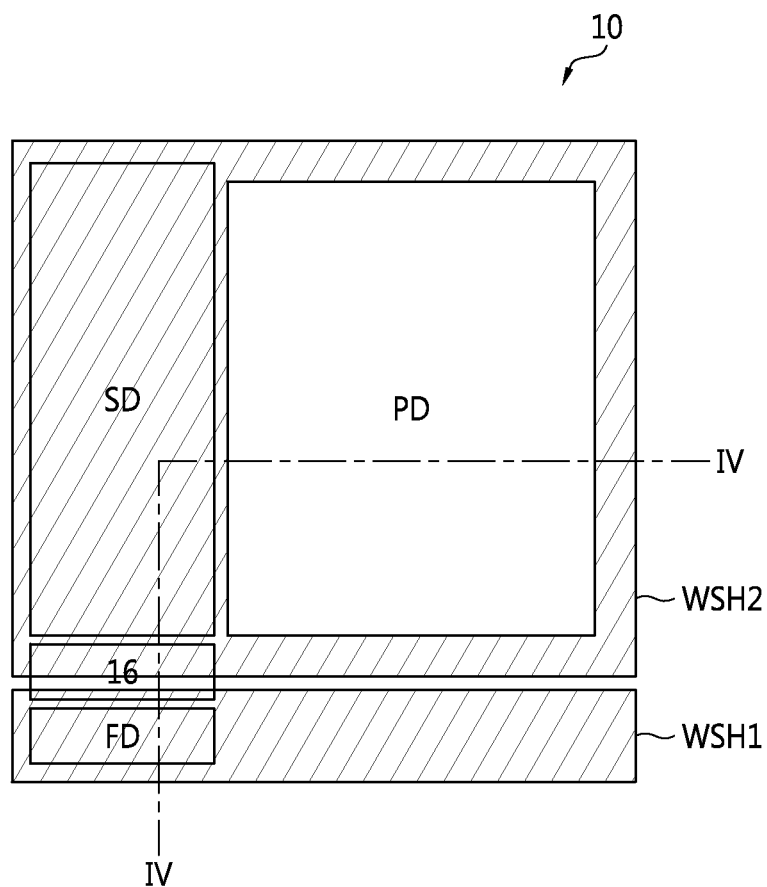
Figure 4:
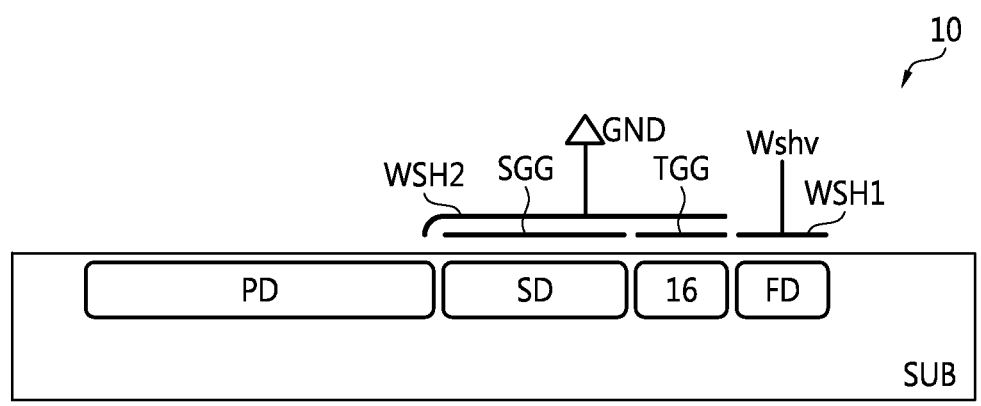
FIG. 4 is a cross sectional view of the pixel, taken along the line IV-IV illustrated in FIG. 3A or 3B.

FIGS. 3A and 3B are plan views of each pixel 10 illustrated in FIG. 1 according to at least one example embodiment of the inventive concepts. FIG. 4 is a cross sectional view of the pixel 10, taken along the line IV-IV illustrated in FIG. 3A or 3B. The plan view of the pixel 10 illustrated in FIG. 3A is substantially the same or similar to that illustrated in FIG. 3B except for a region in which a first light-shielding material WSH1 is formed and a region in which a second light-shielding material WSH2 is formed.

Referring to FIGS. 1 through 4, the first light-shielding material WSH1 is formed on or above a floating diffusion node FD (or first storage element) and the second light-shielding material WSH2 is formed on or above a storage diode SD (or second storage element). The first light-shielding material WSH1 is electrically separated (or electrically isolated) from the second light-shielding material WSH2. For example, the first light-shielding material WSH1 and the second light-shielding material WSH2 may be tungsten or include tungsten, but the inventive concepts are not restricted to this example.

The first voltage Wshv applied to the first light-shielding material WSH1 may be different from the second voltage GND applied to the second light-shielding material WSH2. For example, the second voltage GND may be a ground voltage while the first voltage Wshv may be higher than the ground voltage.

When the first voltage Wshv is applied to the first light-shielding material WSH1, the voltage of the floating diffusion node FD is boosted. In other words, as the first voltage Wshv is applied to the first light-shielding material WSH1, the charge storage capacity of the floating diffusion node FD is increased.

A gate (or gate electrode) TGG of a transfer transistor 16 and a gate (or gate electrode) SGG of the storage diode SD may be formed between a semiconductor substrate SUB and the second light-shielding material WSH2.

A photoelectric conversion element PD, the storage diode SD, the transfer transistor 16, and the floating diffusion node FD may be formed in the semiconductor substrate SUB. For example, the photoelectric conversion element PD may be a photodiode, a phototransistor, a photogate, a pinned photodiode, etc.

Figure 5:
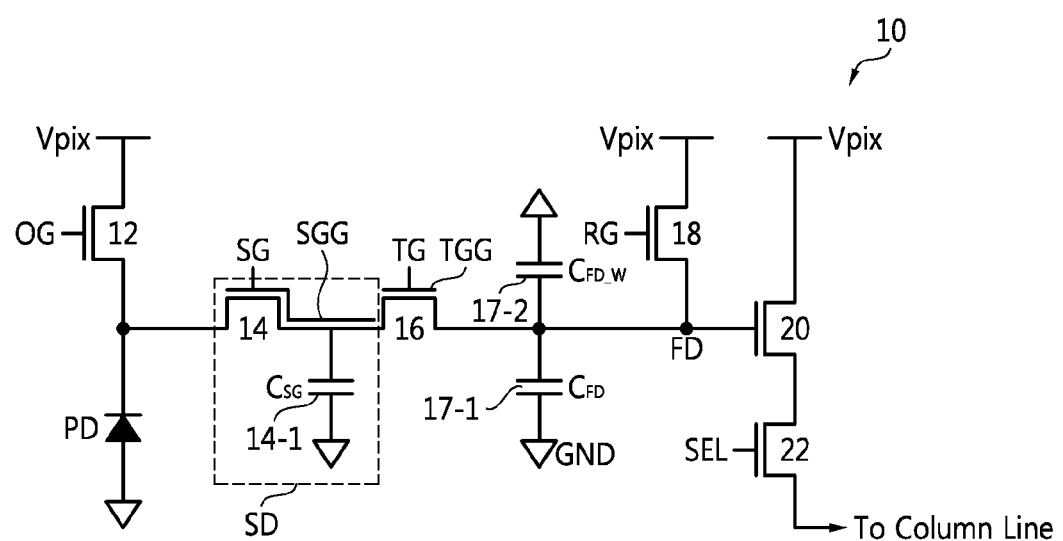
FIG. 5 is a circuit diagram of the pixel illustrated in FIG. 1.

FIG. 5 is a circuit diagram of each pixel 10 illustrated in FIG. 1. Referring to FIGS. 4 and 5, the pixel 10, which can perform a global shutter operation, includes a photoelectric conversion element PD, an overflow transistor 12, a storage transistor 14, a transfer transistor 16, a reset transistor 18, a source follower 20, and a select transistor 22. FIG. 5 also shows parasitic capacitors 14-1, 17-1, and 17-2 which have parasitic capacitances $C_{SG}$, $C_{FD}$, and $C_{FD\_W}$, respectively. Here, it should be understood that parasitic capacitance $C_{FD}$ may be a first capacitive structure including a conductor, the semiconductor substrate SUB, and a ground voltage line while the parasitic capacitance $C_{FD\_W}$ may be a second capacitive structure including the conductor, the semiconductor substrate SUB, and the first light shielding material WSH1.

The photoelectric conversion element PD accumulates or collects charges in response to incident light. The overflow transistor 12 is connected between a first node for the supply of an operating voltage Vpix and the photoelectric conversion element PD. The overflow transistor 12 has an overflow gate. The overflow gate is used to reduce (or alternatively, prevent) charges generated by the photoelectric conversion element PD from overflowing. The overflow transistor 12 is turned on and off in response to an overflow gate signal OG.

For example, when the intensity of incident light on the pixel 10 is high or when the sun or an electric light is shot, that is, in case of a white level or high illuminance, the overflow transistor 12 is used to reduce (or alternatively, prevent) charges (e.g., electrons) generated in the photoelectric conversion element PD from overflowing into the storage diode SD.

The storage transistor 14 is connected between the photoelectric conversion element PD and the transfer transistor 16. Charges from the photoelectric conversion element PD are stored in the parasitic capacitor 14-1 through the storage transistor 14. The storage diode SD includes the storage transistor 14 and the parasitic capacitor 14-1. The storage transistor 14 is turned on and off in response to the storage transistor control signal SG applied to the gate SGG.

The transfer transistor 16 is connected between the storage transistor 14 and the floating diffusion node FD. The charges stored in the parasitic capacitor 14-1 are integrated or accumulated in the floating diffusion node FD through the transfer transistor 16. The transfer transistor 16 is turned on and off in response to the transfer control signal TG applied to the gate TGG.

The reset transistor 18 is connected between a second node for the supply of the operating voltage Vpix and the floating diffusion node FD. The reset transistor 18 transmits charges (e.g., electrons) from the floating diffusion node FD to the second node in response to the reset control signal RG. The source follower 20 is connected between a third node for the supply of the operating voltage Vpix and the select transistor 22. The source follower 20 operates based on a voltage determined from the charges at the floating diffusion node FD.

For clarity of the description, the operating voltage Vpix is commonly supplied to the first through third nodes in the example embodiment illustrated in FIG. 5, but different operating voltages may be supplied to the first through third nodes, respectively, in at least one other example embodiment. The select transistor 22 may output an output signal (e.g., an analog pixel signal) of the source follower 20 to a column line in response to the selection signal SEL.

Figure 6:
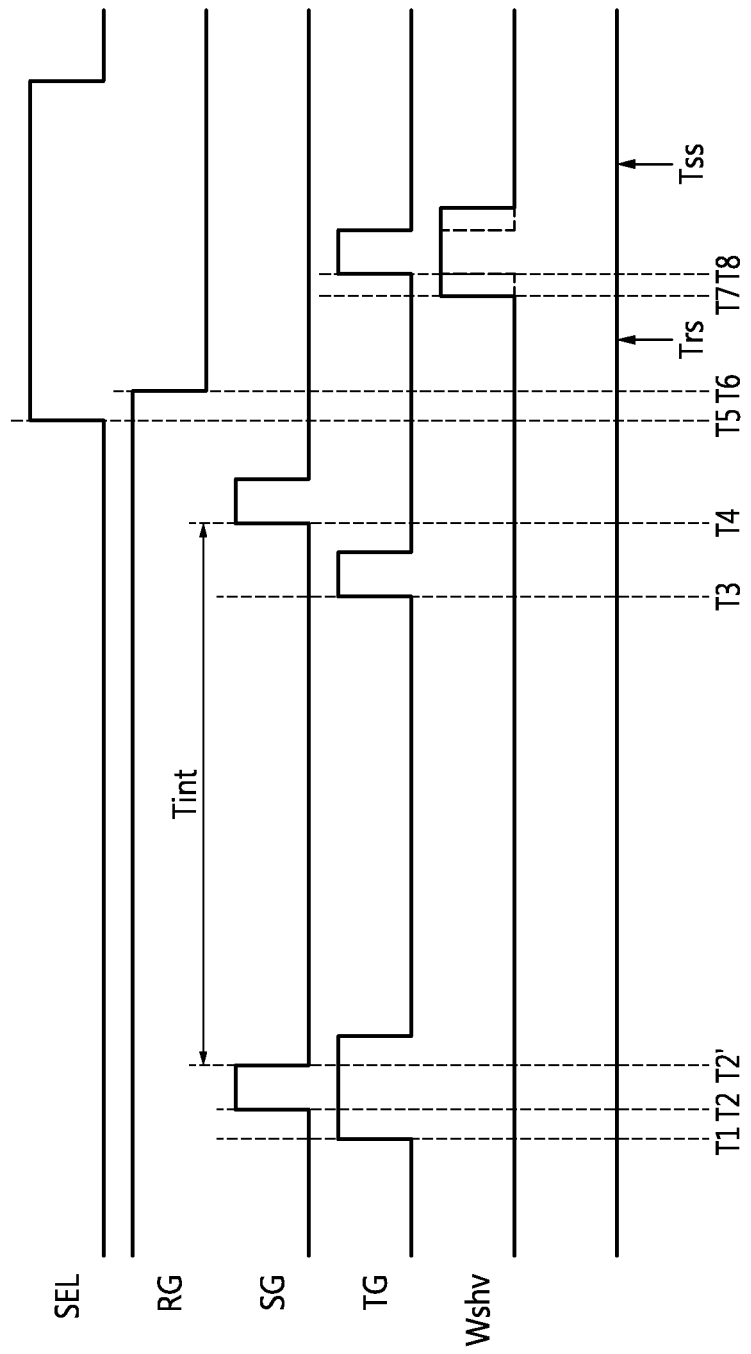
FIG. 6 is a timing chart of the control signals illustrated in FIG. 2 according to at least one example embodiment of the inventive concepts.

FIG. 6 is a timing chart of the control signals SEL, RG, SG, TG, and Wshv illustrated in FIG. 2 according to at least one example embodiment of the inventive concepts. Referring to FIGS. 4 through 6, the transfer control signal TG transits to a high level at a time T1. Since the reset signal RG is at a high level at the time T1, charges (e.g., electrons) stored in the parasitic capacitors 14-1, 17-1, and 17-2 are discharged to the second node through the reset transistor 18.

The storage transistor control signal SG transits to a high level at a time T2. As a result, charges stored in the photoelectric conversion element PD are discharged to the second node through the transistors 14, 16, and 18. The transfer control signal TG transits to the high level at a time T3. As a result, charges (e.g., electrons) stored in the parasitic capacitors 14-1, 17-1, and 17-2 are discharged to the second node through the reset transistor 18.

During an integration time Tint from a time T2' to a time T4, the photoelectric conversion element PD generates charges using incident light. The storage transistor control signal SG transits to the high level at the time T4, and therefore, the charges at the photoelectric conversion element PD are stored in the parasitic capacitor 14-1 through the storage transistor 14.

The selection signal SEL transits to a high level at a time T5. The reset signal RG transits to a low level at a time T6. The reset signal RG is sampled at a time Trs. The sampling of the reset signal RG may be performed by the CDS block 150 and the comparator block 152.

The first voltage Wshv, e.g., a positive voltage that can boost a voltage of the floating diffusion node FD is applied to the first light-shielding material WSH1 at a time T7. The transfer control signal TG transits to the high level at a time T8. Accordingly, the charges at the parasitic capacitor 14-1 are stored in the parasitic capacitors 17-1 and 17-2.

With reference to times T7 and T8, the row driver 130 applies the transfer control signal TG having a first pulse width to the gate TGG of the transfer transistor 16 and applies the first voltage Wshv having a second pulse width to the first light-shielding material WSH1. At this time, the second pulse width may be the same as or greater than the first pulse width.

The application (or supply) time T7 of the first voltage Wshv is the same as or earlier than the application (or supply) time T8 of the transfer control signal TG. Here, the parasitic capacitor 17-1 may correspond to a result of modeling a parasitic capacitor created (or generated) by the floating diffusion node FD. The parasitic capacitor 17-2 may correspond to a result of modeling a parasitic capacitor created by the floating diffusion node FD when the first voltage Wshv is applied to the first light-shielding material WSH1. Accordingly, when the first voltage Wshv is applied to the first light-shielding material WSH1, the pixel 10 also creates or generates the parasitic capacitor 17-2, which is an effect different than conventional pixels. For example, a ratio $C_{FD}:C_{FD\_W}=4:1$ may be realized, but this is just an example.

An image signal is sampled at a time Tss. The sampling of the image signal may be performed by the CDS block 150 and the comparator block 152.

Figure 7:
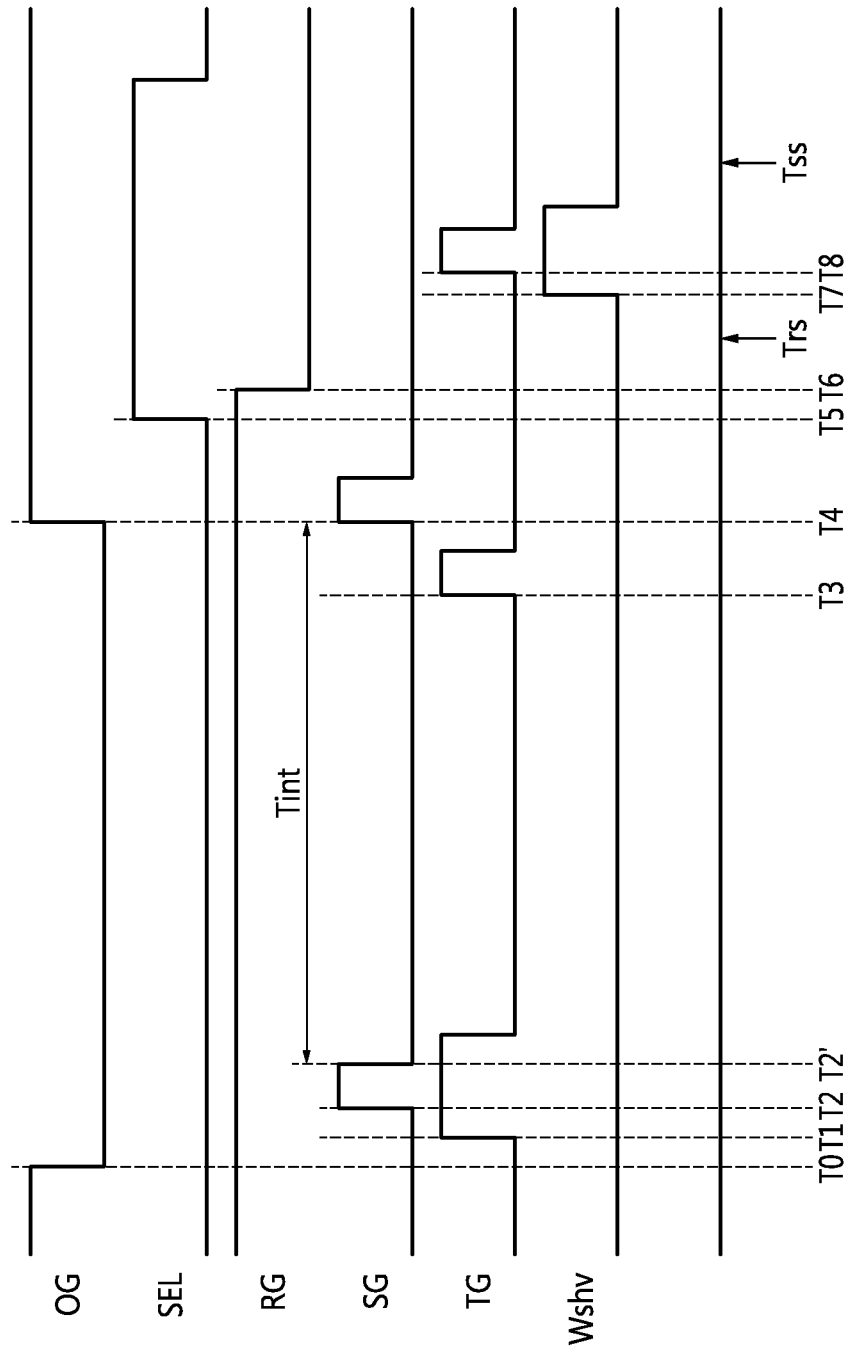
FIG. 7 is a timing chart of the control signals illustrated in FIG. 2 according to at least one example embodiment of the inventive concepts.

FIG. 7 is a timing chart of the control signals OG, SEL, RG, SG, TG, and Wshv illustrated in FIG. 2 according to at least one other example embodiment of the inventive concepts. Referring to FIGS. 6 and 7, the overflow gate signal OG at a high level is applied to a gate of the overflow transistor 12 up to a time T0. Accordingly, charges at the photoelectric conversion element PD are discharged to the first node through the overflow transistor 12.

The operation of the pixel 10 from the time T1 to the time Tss illustrated in FIG. 7 is substantially the same as or similar to that from the time T1 to the time Tss illustrated in FIG. 6. Thus, detailed descriptions thereof will be omitted. For clarity of the description, it is assumed that each of the transistors 12, 14, 16, 18, 20, and 22 illustrated in FIG. 5 is implemented as an NMOS transistor and the transistors 12, 14, 16, 18, and 22 are turned on in response to the control signals OG, SG, TG, RG, and SEL, respectively, at the high level. However, example embodiments are not limited thereto.

Figure 8:
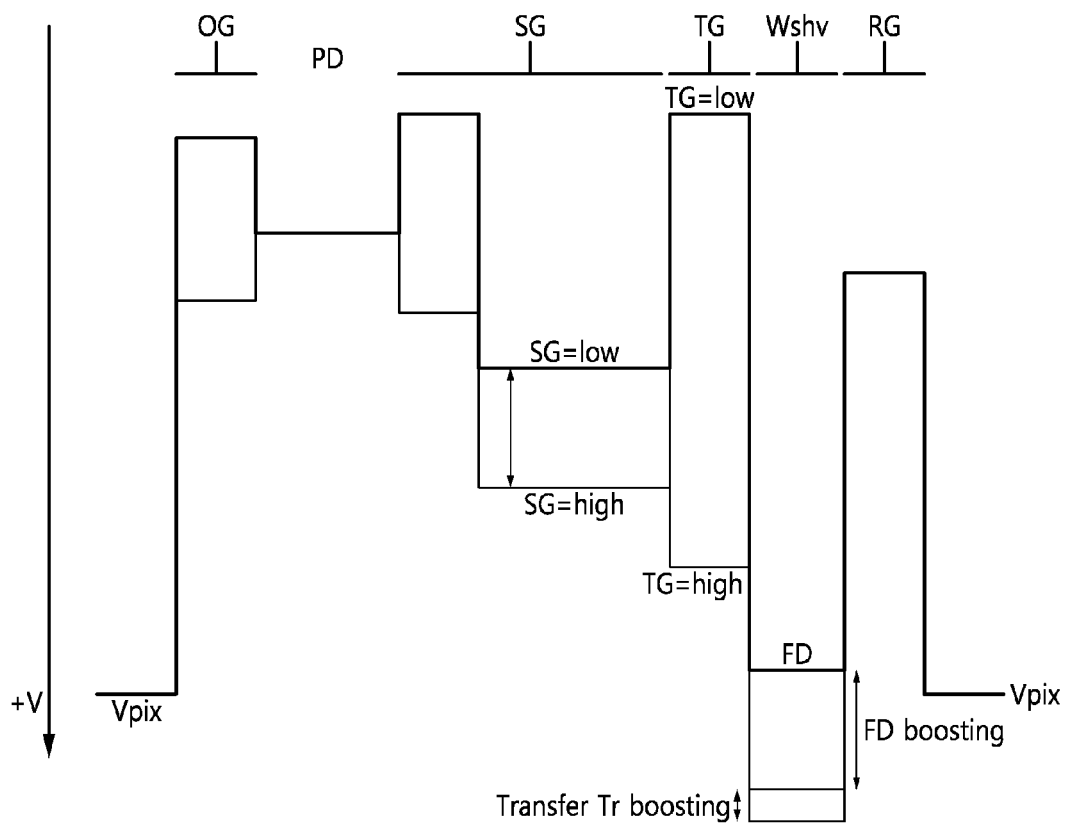
FIG. 8 is a potential diagram with respect to the control signals illustrated in FIG. 2.

FIG. 8 is a potential diagram 10 with respect to the control signals OG, SG, TG, Wshv, and RG illustrated in FIG. 2.

Referring to FIGS. 4 through 8, when the first voltage Wshv, e.g., a positive voltage is applied to the first light-shielding material WSH1, the amount of charges that can be stored in the floating diffusion node FD increases. Consequently, the voltage of the floating diffusion node FD is boosted.

Figure 9:
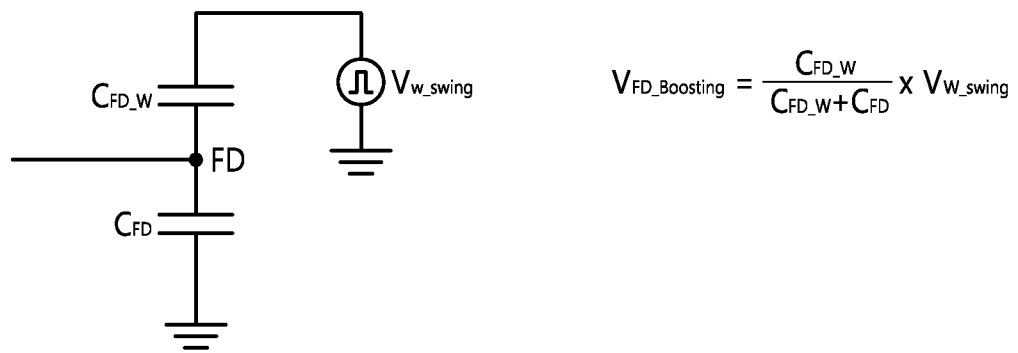
FIG. 9 is a conceptual diagram for explaining the boosting effect of a floating diffusion node illustrated in FIG. 4.

FIG. 9 is a conceptual diagram for explaining the boosting effect of the floating diffusion node FD illustrated in FIG. 4. Referring to FIGS. 4 through 9, a voltage $V_{FD\_Boosting}$ of the floating diffusion node FD may be defined as:

$$V_{FD\_Boosting} = \frac{C_{FD\_W}}{C_{FD\_W} + C_{FD}} \times V_{W\_swing},$$

where $V_{W\_swing}$ is a swing width or swing range of the operating voltage Vpix. For example, when $V_{W\_swing}$ is 4.5 V and $C_{FD\_W}/C_{FD}$ is 0.25, the voltage $V_{FD\_Boosting}$ of the floating diffusion node FD may be boosted to 0.9 V.

Figure 10:
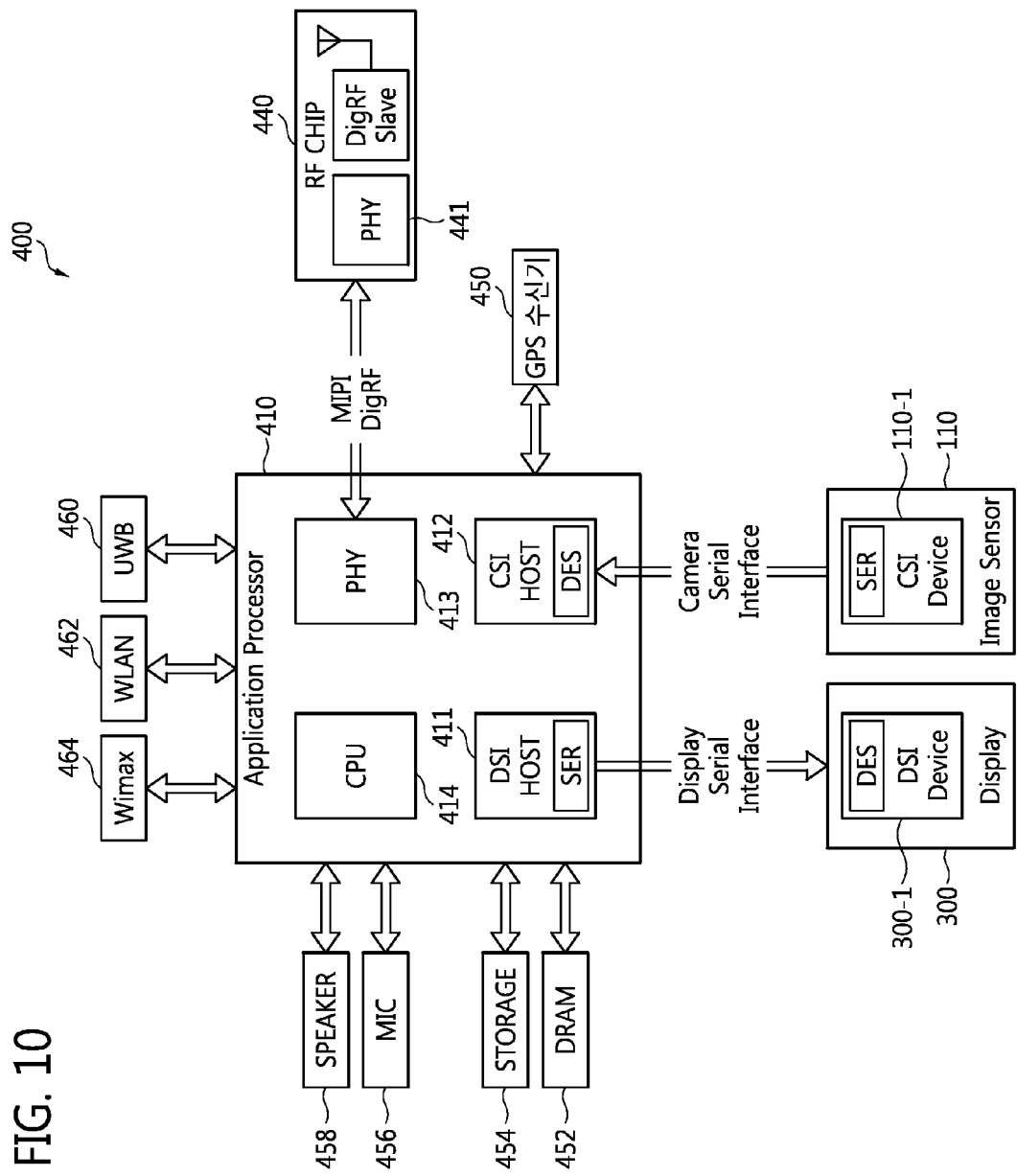
FIG. 10 is a block diagram of an image processing system according to at least one example embodiment of the inventive concepts and FIG. 11 is a flowchart of the operations of the pixel illustrated in FIG. 1.

FIG. 10 is a block diagram of an image processing system 400 according to at least one other example embodiment of the inventive concepts. Referring to FIGS. 1 through 10, the image processing system 400 may use or support mobile industry processor interface (MIPI®).

The image processing system 400 may be implemented as a laptop computer, a cellular phone, a smart phone, a tablet PC, a PDA, an EDA, a digital still camera, a digital video camera, a PMP, a MID, a wearable computer, an IoT device, or an IoE device. The image processing system 400 includes an application processor (AP) 410, the image sensor 110, and the display 300.

A camera serial interface (CSI) host 412 in the AP 410 may perform serial communication with a CSI device 110-1 in the image sensor 110 through CSI. A deserializer DES and a serializer SER may be included in the CSI host 412 and the CSI device 110-1, respectively. The image sensor 110 includes the pixel 10 which includes the first and second light-shielding materials WSH1 and WSH2 separated from each other and which has a structure that can boost the voltage of the floating diffusion node FD, as described with reference to FIGS. 1 through 9.

A display serial interface (DSI) host 411 in the AP 410 may perform serial communication with a DSI device 300-1 in the display 300 through DSI. A serializer SER and a deserializer DES may be included in the DSI host 411 and the DSI device 300-1, respectively. The image data IDATA output from the image sensor 110 may be transmitted to the AP 410 through CSI. The AP 410 may process the image data IDATA and transmit processed image data to the display 300 through DSI.

The image processing system 400 may also include a radio frequency (RF) chip 440 communicating with the AP 410. A physical layer (PHY) 413 in the AP 410 and a PHY 441 in the RF chip 440 may communicate data with each other according to MIPI DigRF.

A central processing unit (CPU) 414 may control the operations of the DSI host 411, the CSI host 412, and the PHY 413. The CPU 414 may include at least one core. The AP 410 may be implemented in an integrated circuit (IC) or a system on chip (SoC). The AP 410 may be a processor or a host that can control the operations of the image sensor 110.

The image processing system 400 may further include a global positioning system (GPS) receiver 450, a volatile memory 452 such as dynamic random access memory (DRAM), a data storage 454 formed using non-volatile memory such as flash-based memory, a microphone (MIC) 456, and/or a speaker 458. The data storage 454 may be implemented as a universal flash storage (UFS), a multimedia card (MMC), an embedded MMC (eMMC), or a memory card.

The image processing system 400 may communicate with external devices using at least one communication protocol or standard, e.g., ultra-wideband (UWB) 460, wireless local area network (WLAN) 462, worldwide interoperability for microwave access (Wimax) 464, or long term evolution (LTE™) (not shown). In other embodiments, the image processing system 400 may also include a near field communication (NFC) module, a WiFi module, or a Bluetooth module.

Figure 11:
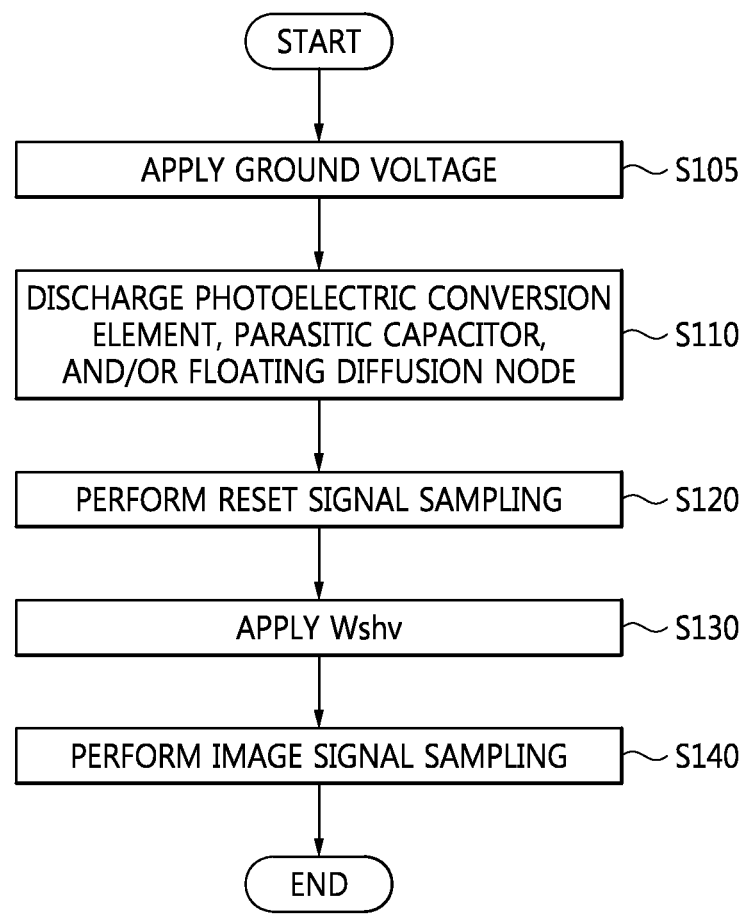

FIG. 11 is a flowchart of the operations of each of the pixels 10 illustrated in FIG. 1. Referring to FIGS. 1 through 11, the second voltage GND is applied to the second light-shielding material WSH2 through the ground line L17 in operation S105.

In operation S110, the row driver 130 discharges charges at the photoelectric conversion element PD, charges at the parasitic capacitors 14-1, 17-1, and 17-2, and/or charges at the floating diffusion node FD through the first node and/or the second node at the times T0, T1, T2, and T3. In operation 120, the row driver 130 performs reset signal sampling at the time Trs.

While the second voltage GND lower than the first voltage Wshv is being applied to the first light-shielding material WSH1, the row driver 130 applies the first voltage Wshv for boosting the voltage of the floating diffusion node FD to the first light-shielding material WSH1 in operation S130. Image signal sampling is performed at the time Tss in operation S130.

As described above, according to at least one example embodiment of the inventive concepts, an image sensor boosts the voltage of a floating diffusion node without increasing both an operating voltage applied to pixels and the capacitance of the floating diffusion node.

While the inventive concepts have been particularly shown and described with reference to example embodiments thereof, it will be understood by those of ordinary skill in the art that various changes in forms and details may be made therein without departing from the spirit and scope of the inventive concepts as defined by the following claims.

What is claimed is:

1. An image sensor comprising:
    a floating diffusion node and a storage element, the floating diffusion node and the storage node being in a semiconductor substrate;
    a first light-shielding material formed over the floating diffusion node; and
    a second light-shielding material formed over the storage element, the second light-shielding material being completely separated from the first light-shielding material, wherein voltage can be applied to the first light-shielding material and the second light-shielding material.

2. The image sensor of claim 1, further comprising:
    a first voltage supply line configured to apply a first voltage to the first light-shielding material; and
    a second voltage supply line configured to apply a second voltage lower than the first voltage to the second light-shielding material.

3. The image sensor of claim 2, wherein the second voltage supply line is a ground line.

4. The image sensor of claim 1, wherein the first light-shielding material and the second light-shielding material include tungsten.

5. An image processing system comprising:
an image sensor; and
a processor configured to process image data output from the image sensor, wherein the image sensor comprises, a floating diffusion node and a storage element, the floating diffusion node and the storage node being in a semiconductor substrate, a first light-shielding material formed over the floating diffusion node, and
a second light-shielding material formed over the storage element, the first light-shielding material being completely separated from the first light-shielding material, and voltage can be applied to the first light-shielding material and the second light-shielding material.

6. The image processing system of claim 5, further comprising:
a first voltage supply line configured to apply a first voltage to the first light-shielding material; and
a second voltage supply line configured to apply a second voltage to the second light-shielding material, the second voltage being lower than the first voltage.

7. The image processing system of claim 6, further comprising:
a row driver configured to apply the first voltage, to the first light-shielding material through the first voltage supply line, the first voltage being a positive voltage.

8. The image processing system of claim 5, wherein the image sensor is configured to perform a global shutter operation.

9. The image processing system of claim 5, wherein the image sensor further comprises:
a photoelectric conversion element in the semiconductor substrate;
a transfer transistor configured to transfer charges accumulated by the photoelectric conversion element to the floating diffusion node; and
a row driver configured to apply a transfer control signal having a first pulse width to a gate of the transfer transistor and to apply a positive voltage having a second pulse width to the first light-shielding material, wherein the second pulse width is greater than or equal to the first pulse width.

10. The image processing system of claim 9, wherein the row driver is configured to apply the positive voltage at a time the same as or earlier than a time at which the transfer control signal is applied.

11. The image processing system of claim 5, wherein the image sensor further comprises:
a source follower configured to operate according to a voltage of the floating diffusion node;
a selection transistor configured to apply an output voltage of the source follower to a column line in response to a selection signal; and
a row driver configured to generate the selection signal and to apply a positive voltage to the first light-shielding material while the selection signal is activated.

12. The image processing system of claim 5, wherein the image sensor includes a sampler that is configured to sample a reset signal before a positive voltage is applied to the first light-shielding material and sample an image signal after the positive voltage is applied to the first light-shielding material.

13. The image processing system of claim 5, further comprising:
a serial camera interface configured to transmit the image data from the image sensor to the processor.

14. An image sensor comprising:
a first storage element and a second storage element, the first storage element and the second storage element being configured to store charges collected by a photoelectric conversion element;
a first light-shielding material covering the first storage element; and
a second light-shielding material covering the second storage element, the second light-shielding material being electrically isolated from the first light-shielding material, the second light-shielding material being completely separated from the first light-shielding material, and voltage can be applied to the first light-shielding material and the second light-shielding material.

15. The image sensor of claim 14, wherein
the first storage element and the second storage element are in a semiconductor substrate, and the first storage element includes
a first capacitive structure and a second capacitive structure,
the first capacitive structure including a conductor, the semiconductor substrate, and a ground voltage line,
the second capacitive structure including the conductor, the semiconductor substrate, and the first light shielding material,
and the second storage element is a storage diode.

16. The image sensor of claim 14, wherein the first light-shielding material and the second light-shielding material include tungsten.

17. The image sensor of claim 14, further comprising:
a row driver configured to boost a storage capacity of the first storage element by applying a first voltage to the first storage element while a second voltage is applied to the second storage element, the first voltage being greater than the second voltage.

18. The image sensor of claim 17, further comprising:
a transfer element configured to apply a transfer control signal such that charges collected by the photoelectric conversion element are transferred from the second storage element to the first storage element having the boosted storage capacity.

19. The image sensor of claim 17, further comprising:
a sampler configured to sample a reset signal before the row driver applies the first voltage and sample an image signal after the row driver applies the first voltage, the image signal being a signal generated by charges stored the first storage element having the boosted storage capacity.

20. The image sensor of claim 17, wherein the first voltage is a positive voltage and the second voltage is a ground voltage.

* * * * *